United States Patent [19]
Fitzpatrick et al.

[11] Patent Number: 5,063,343
[45] Date of Patent: Nov. 5, 1991

[54] CURRENT PUMP STRUCTURE

[75] Inventors: Mark E. Fitzpatrick, San Jose; Gary R. Gouldsberry, Cupertino, both of Calif.

[73] Assignee: Gazelle Microcircuits, Inc., Santa Clara, Calif.

[21] Appl. No.: 506,418

[22] Filed: Apr. 5, 1990

[51] Int. Cl.[5] .................................................. G05F 3/08
[52] U.S. Cl. .................................... 323/317; 323/272; 323/312; 307/577
[58] Field of Search ............... 323/271, 272, 311, 312, 323/313, 314, 315, 316, 317; 307/571, 577, 584

[56] References Cited

U.S. PATENT DOCUMENTS

| | | | |
|---|---|---|---|
| 4,051,428 | 9/1977 | Imai | 323/317 |
| 4,429,270 | 1/1984 | Davies et al. | 323/317 |
| 4,727,309 | 2/1988 | Vajdic et al. | 323/315 |

Primary Examiner—Peter S. Wong
Attorney, Agent, or Firm—Skjerven, Morrill, MacPherson, Franklin & Friel

[57] ABSTRACT

In a current pump, three separate current sources, each providing an identical current, are used. A first current pump is provided between an output load and a positive power supply terminal to provide a positive current to a load. To enable the current pump to provide a zero current to the load or withdraw a current from the load, second and third current pumps are provided in parallel between the load and a ground terminal. Associated switches couple these second and third current sources to the load. Thus, three states of the current pump are available which provide either a positive current, a negative current, or a zero current to a load.

12 Claims, 3 Drawing Sheets

CURRENT PUMP STRUCTURE

FIELD OF THE INVENTION

This invention relates to electronic circuits and in particular to an electronic current pump circuit for selectively applying a current to an output.

BACKGROUND OF THE INVENTION

FIG. 1 shows a prior art charge or current pump for providing a current to load Z through resistor R1. In this prior art device, a switching circuit SW couples an input of load Z to either a plus voltage +V at terminal 1, a negative voltage −V at terminal 2, or an open circuit terminal 3. Thus, when switch SW is coupled to terminal 1, a positive current will flow through resistor R1 while, when switch SW is connected to terminal 2, a negative current will flow through resistor R1. When switch SW is coupled to terminal 3, ideally no current will flow through resistor R1.

An alternative prior art current pump is shown in FIG. 2 where switch SW couples an input of load Z to either a positive current source +I at terminal 1, a negative current source −I at terminal 2, or an open circuit terminal 3. When switch SW is coupled to terminal 3, ideally no current will flow through load Z.

FIG. 3 shows a prior art current pump circuit which provides to a load connected to node 1 either a high voltage, a low voltage, or a high impedance. If a control signal applied to terminal PD is low while a control signal applied to terminal PU is high, a high voltage will appear at node 1, and a positive current will flow from node 1 to a load. By applying a low voltage to the circuit at input terminal PD, transistor Q1 will turn on and pull the base of transistor Q2 down, preventing transistor Q2 from turning on. Transistor Q3 will then only turn partially on and not fully on in order to maintain a voltage at its collector sufficient to turn transistor Q4 on and provide a current across resistors R1 and R2 to supply the necessary bias voltage to the base of transistor Q3. The high voltage at the emitter of transistor Q4 will cause a high voltage to appear at node 1. If the voltage applied to input terminal PU is high at this time, diode D1 would be reversed biased and act as an open circuit. Thus, with PD low and PU high, a positive current will flow to a load from node 1.

Alternatively, to provide a negative current at node 1, a low voltage is applied to terminal PU so as to cause the voltage at the emitter of transistor Q5 to be clamped at a maximum of one diode drop above the low voltage at terminal PU. This insures that transistor Q3 cannot be turned on since its base voltage is necessarily clamped at one diode drop above ground due to the voltage at the emitter of transistor Q5 being clamped at one diode drop above ground. If the voltage applied to terminal PD is high, transistor Q1 will conduct in the reverse direction and turn transistor Q2 fully on. This will render transistors Q4 and Q5 nonconductive. Thus the voltage at node 1 will be low, and the output current will be negative.

For an effective open circuit at node 1, input voltages applied to terminals PD and PU are made high so that transistor Q5 is off and diode D1 is off, causing node 1 to be isolated.

For a current pump of the type shown in FIG. 1 to operate as a constant current pump, load Z must be of a very low impedance compared to R1. This will make the node that load Z is attached to appear as a virtual ground. Hence, when the switch is connected to either voltage source, there is a constant voltage across R and therefore a constant current. However, frequently load Z is not of a low impedance and may in fact have a varying impedance. Thus, the current pumped may not be constant or well-defined.

Another drawback to the type of current pump shown in FIG. 1 is the difficulty in real circuits of isolating the unconnected terminals of the switch from the output node. For example, if the switch is connected to terminal 3, there may be leakage onto the output node from the unconnected terminals 1 and 2.

Current pumps of the type shown in FIG. 2 also have this difficulty in isolating unconnected terminals. A disadvantage, in some implementations, of the circuit of FIG. 2 is that an unconnected current source can drift to an unknown and unwanted voltage. This can cause troublesome transients when that terminal is connected back to the load.

One of the advantages of the type of current pumps shown in FIG. 2 over the type of current pumps shown in FIG. 1 is its immunity to noise on the power supply line. Since the voltage sources used in the FIG. 1 type of circuits are low impedance, any noise on the power supply line can be easily transmitted through the closed switch to the output terminal. The FIG. 2 type pumps use current sources, which are inherently high impedance, therefore much more immune to noise on the power supply line.

Further, since in operation, a current pump output is applied intermittently to a load for fixed durations, charge supplied during a positive current pulse ideally should negate the charge removed during a negative current pulse of the same duration. It is difficult to precisely set the high voltage and low voltage output levels of the current pump to that necessary to cause a positive current pulse to transfer the same charge as a negative current pulse having a same duration.

SUMMARY OF THE INVENTION

A preferred embodiment of an inventive current pump is disclosed herein which overcomes the above-described problems with prior art current pumps. In this current pump, three separate current sources, each providing an identical current, are used. A first current source is provided between an output lead of the current pump and a positive power supply terminal to provide a positive current to a load connected to the output lead. To enable the current pump to provide a zero current to the load or a negative current to the load, second and third current sources are provided in parallel between the output lead and a ground terminal. Associated switches couple these second and third current sources to the output lead.

When the switch associated with the second current source is closed, coupling the second current source to the load, this second current source pulls to ground all current from the first current source so that zero current is made available to the load. If the switch coupling the third current source to the load is then also closed, a negative current will now be provided to the load.

Thus, three states of the current pump are available which provide either a positive current, a negative current or a zero current to a load.

Since, by matching components, it is not very difficult to identically reproduce current sources on a single chip, the above-described current pump produces highly reliable results.

DETAILED DESCRIPTION OF THE PREFERRED EMBODIMENT

Figure 1:
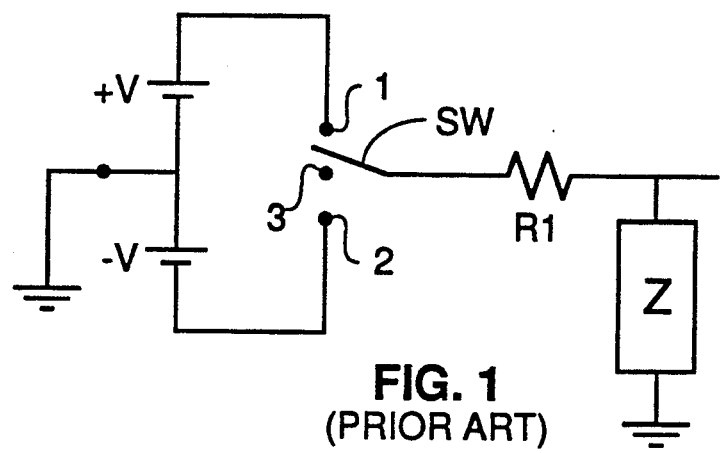
FIG. 1 illustrates a prior art current pump using voltage sources.
Figure 2:
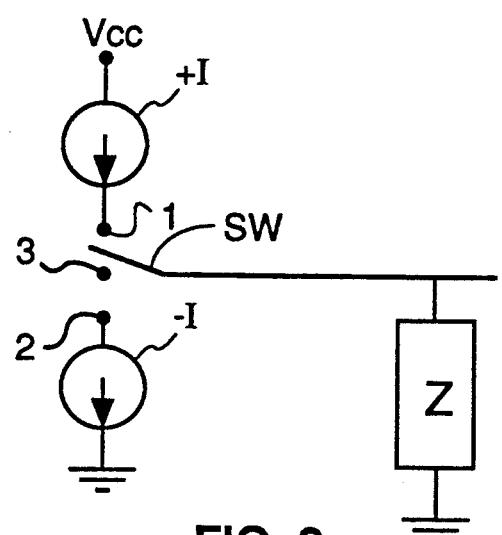
FIG. 2 illustrates a prior art current pump using two current sources alternately connected to a load.
Figure 3:
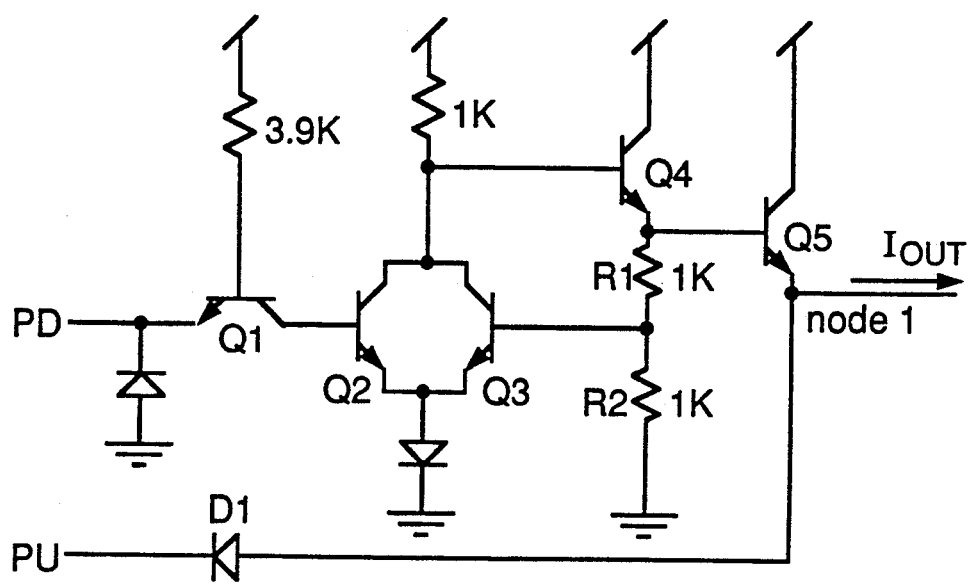
FIG. 3 illustrates a prior art circuit which generates a high voltage, a low voltage, and an open circuit for use as a current pump.
Figure 4:
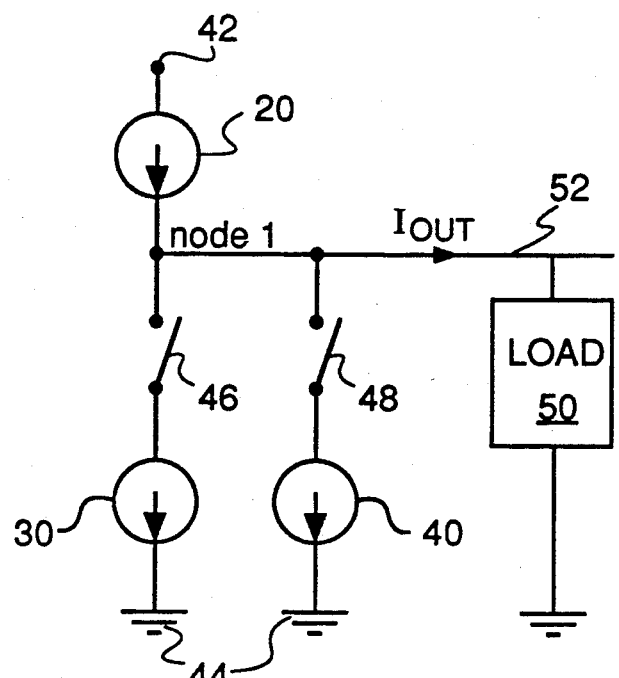
FIG. 4 is a schematic diagram showing an embodiment of the inventive current pump.

FIG. 4 shows a preferred embodiment of the invention comprising current sources 20, 30, and 40. Current source 20 provides a constant fixed source of current to node 1 from power supply terminal 42. Current source 30 is identical to current source 20 and is connected between node 1 and ground terminal 44 via switch 46. Current source 40 is identical to current sources 20 and 30 and is connected between node 1 and ground terminal 44 via switch 48.

Load 50 to which a positive current, a negative current, or a zero current is to be applied is effectively coupled to node 1 by conductor 52.

When switches 46 and 48 are opened, as in the case shown in FIG. 4, positive current supplied by current source 20 is provided at node 1 and is conducted via conductor 52 to load 50 and to any other loads connected to conductor 52.

If only switch 46 is closed, all current supplied to node 1 by current source 20 is removed by current source 30 so that zero current is made available to conductor 52.

If both switches 46 and 48 are closed, the additional current drawn by current source 40 will be drawn from loads, such as load 50, connected to conductor 52 so that a negative current will flow on conductor 52.

Thus, by using the circuit of FIG. 4, when zero current is to be applied to conductor 52, there is essentially no leakage on conductor 52, since any leakage current by current sources 20 and 30 substantially cancel each other out. Further, the current (positive or negative) made available to conductor 52 is not dictated by a level of voltage at node 1 so that setting of absolute voltage levels at node 1 is not necessary.

Further, since the currents generated by current sources 20, 30, and 40 could be constructed so as to not be significantly affected by power supply voltage fluctuations, the current made available to conductor 52 could be made insensitive to noise or power supply fluctuations.

Figure 5:
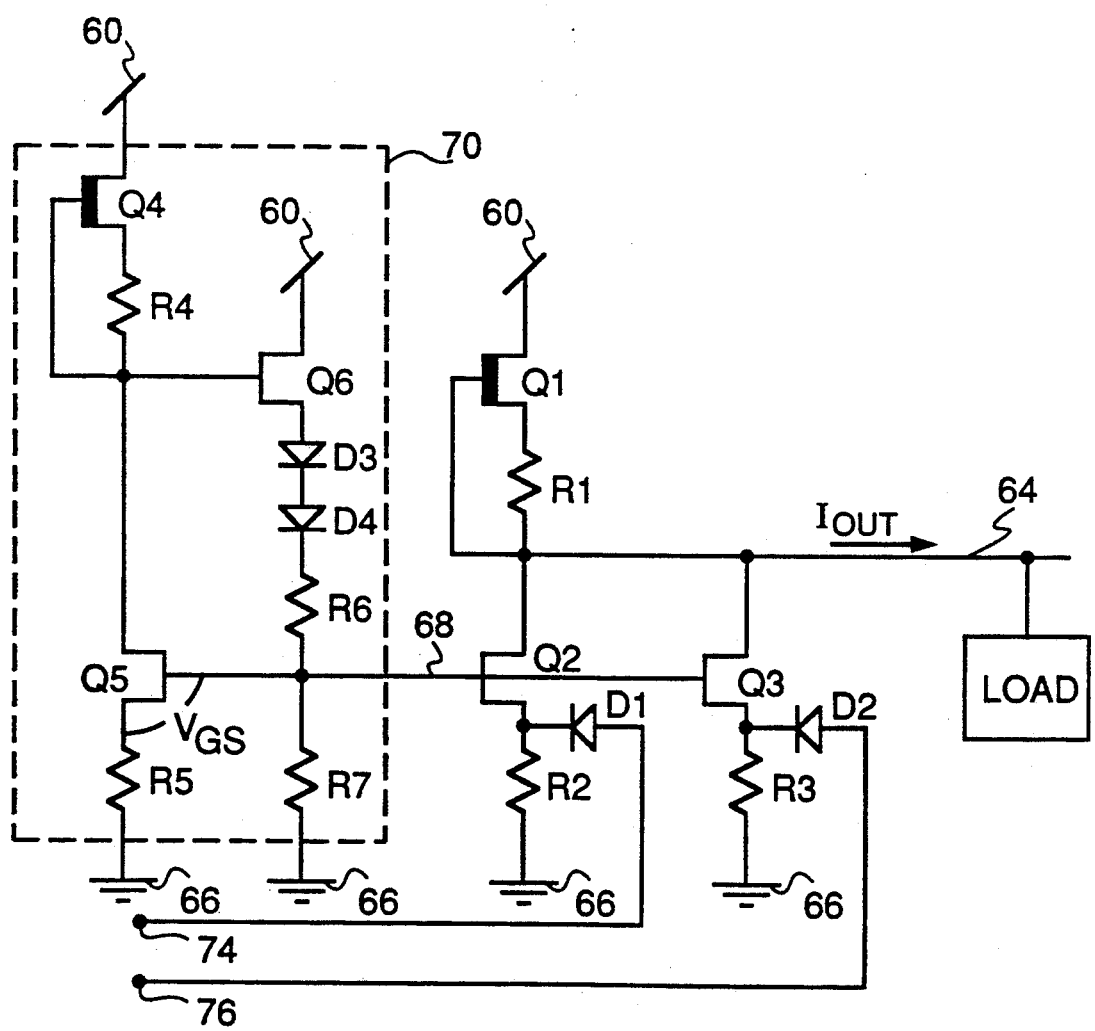
FIG. 5 shows a circuit implementation of the embodiment shown in FIG. 4.

FIG. 5 shows one embodiment of a circuit for implementing the structure of FIG. 4, where current source 20 in FIG. 4 comprises depletion mode transistor Q1, having its drain coupled to power supply voltage terminal 60 and having its gate coupled to its source via resistor R1. The gate of transistor Q1 is coupled to node 1, to which is connected conductor 64 providing an output lead of the current pump.

Current pump 30 in FIG. 4 comprises enhancement mode transistor Q2, having its drain coupled to node 1 and having its source connected to ground terminal 66 via resistor R2. Bias voltage is applied to the gate of transistor Q2 via conductor 68 to set the current through transistor Q2 to match the current through transistor Q1. The voltage on conductor 68 is provided by biasing circuit 70, which will be explained in more detail later.

Switch 46 in FIG. 4 comprises diode D1 in conjunction with transistor Q2 and resistor R2, diode D1 having its cathode coupled to the source of transistor Q2 and its anode coupled to control terminal 74.

Current source 40 in FIG. 4 comprises enhancement mode transistor Q3, having its drain coupled to node 1 and having its source connected to ground terminal 66 through resistor R3. The gate of transistor Q3 is connected to bias voltage conductor 68.

Switch 48 in FIG. 4 comprises diode D2 in conjunction with transistor Q3 and resistor R3, diode D2 having its cathode connected to the source of transistor Q3 and its anode connected to control terminal 76.

Since current sources formed using transistors Q1, Q2, and Q3 are intended to draw identical currents, a bias voltage must be generated for application to the gates of transistors Q2 and Q3 which will cause each of these transistors to draw an identical current as transistor Q1 when these transistors are switched on.

To bias transistors Q2 and Q3 to draw the proper currents, biasing circuit 70 is configured so that the current source formed by depletion mode transistor Q4 and resistor R4, where transistor Q4 has its drain coupled to power supply voltage terminal 60 and its source connected to its gate via resistor R4, provides an identical current as the current provided by transistor Q1 and R1. To achieve this result, transistors Q4 and Q1 are designed to be identical, and resistors R1 and R4 are designed to have identical values, so that currents through Q4 and Q1 will be identical.

The gate of transistor Q4 is coupled to the drain of enhancement mode transistor Q5, whose source is connected to ground terminal 66 via resistor R5. Since transistor Q5 and resistor R5 are connected in series between transistor Q4 and ground terminal 66, the same current which flows through transistor Q4 flows through transistor Q5 and sets up a certain gate-to-source voltage ($V_{GS}$) of transistor Q5. Transistors Q2, Q3, and Q5 are fabricated to be identical, and resistors R2, R3, and R5 are designed to have identical values. Thus, the $V_{GS}$ of transistor Q5 as a result of the current through transistor Q4 will be the same $V_{GS}$ needed across transistor Q2 to draw a current precisely equal to the current flowing through transistor Q1. Since the gates of transistors Q2, Q3, and Q5 are made common by conductor 68, each of transistors Q2, Q3, and Q5 have the same $V_{GS}$ and draw the same current when diodes D1 and D2 are off.

The serial connection of enhancement mode transistor Q6, diode D3, diode D4, resistor R6, and resistor R7 coupled between power supply voltage terminal 60 and ground terminal 66 acts as a level shifter to set up a drain-to-source voltage ($V_{DS}$) across transistor Q5 which will be similar to the $V_{DS}$ across transistors Q3 and Q2 so that transistors Q2, Q3, and Q5 all will have similar operating conditions.

As previously stated, the bias voltage on conductor 68 is set by the current through transistor Q5, which is in turn set by the characteristics of transistor Q4 and resistor R4. This bias voltage on conductor 68 causes a certain current to flow through resistor R7 which must also flow through serially connected transistor Q6, diode D3, diode D4, and resistor R6. Consequently, a predictable voltage drop appears across forward biased diodes D3 and D4, resistor R6, and the gate/source of transistor Q6. The $V_{GS}$ of transistor Q6 is a function of the size of transistor Q6. Thus, the voltage at the drain of transistor Q5 is set by these various voltage drops and, since the typical range of voltage node 64 will experience is known by the circuit designer, these voltage drops across transistor Q6, diode D3, diode D4, and resistor R6 are set to provide substantially the same $V_{DS}$ across transistor Q5 as as the average $V_{DS}$ seen by transistors Q2 and Q3.

As a practical matter, only resistor R6 is adjusted for this matching of $V_{DS}$, since the voltage drops across diodes D3 and D4 will be relatively fixed, resistor R7 will be made to have a relatively high value to draw little current, and transistor Q6 will most likely be designed small to save die area.

If it is desired for the current source comprising transistor Q3 and resistor R3 to cease drawing current from node 1 and conductor 64, a high voltage is simply applied to control terminal 76 to cause diode D2 to become forward biased and to cause the $V_{GS}$ of transistor Q4 to be less than required to turn transistor Q3 on. Thus, transistor Q3 will not draw a current.

Similarly, to turn transistor Q2 off, a high voltage is applied to control terminal 74 to forward bias diode D1 to raise the source voltage of transistor Q2.

Accordingly, if the voltages applied to control terminals 74 and 76 are high, the current applied via transistor Q1 to node 1 is made available on conductor 64 for application to a load. If the voltage on only one of control terminals 74 and 76 is low, the current supplied to node 1 by transistor Q1 will be removed from node 1 via either transistor Q2 or Q3, whichever is on, and zero current will be made available on conductor 64. If a low voltage is applied to both control terminals 74 and 76, both transistors Q2 and Q3 will be on, and a negative current will be provided to conductor 64.

Voltages applied to control terminals 74 and 76 may be those generated by a phase detector in a phase-locked loop type circuit, where current on conductor 64 would be supplied to a low pass filter to raise or lower, as appropriate, the voltage applied to a voltage controlled oscillator (VCO) to match the frequency of the VCO's output signal to a reference signal frequency. Thus, to raise the output frequency of the VCO, a positive current would be applied to the low pass filter so as to raise the voltage at the input of the VCO. Conversely, to lower the output frequency of the VCO, the current pump of FIG. 5 would be controlled to draw a current from the low pass filter to lower the voltage applied to the input of the VCO. When the frequency of the output of the VCO matches of that of the frequency of a reference signal, a zero current would be applied to the low pass filter, and the output of the VCO would be unchanged. It should also be obvious that if a decreasing voltage on the VCO input increased the VCO frequency and vice-versa, the appropriate alterations can be made to the current direction, etc. to the same effect.

It should be noted in FIG. 5 that the characteristics of transistors Q4 and Q5 and resistors R4 and R5 may be set so that much less current flows through transistor Q4 than flows through transistor Q1, but, through proper sizing of transistors Q4 and Q5 and resistors R4 and R5, a desired bias voltage still appears on conductor 68.

Figure 6:
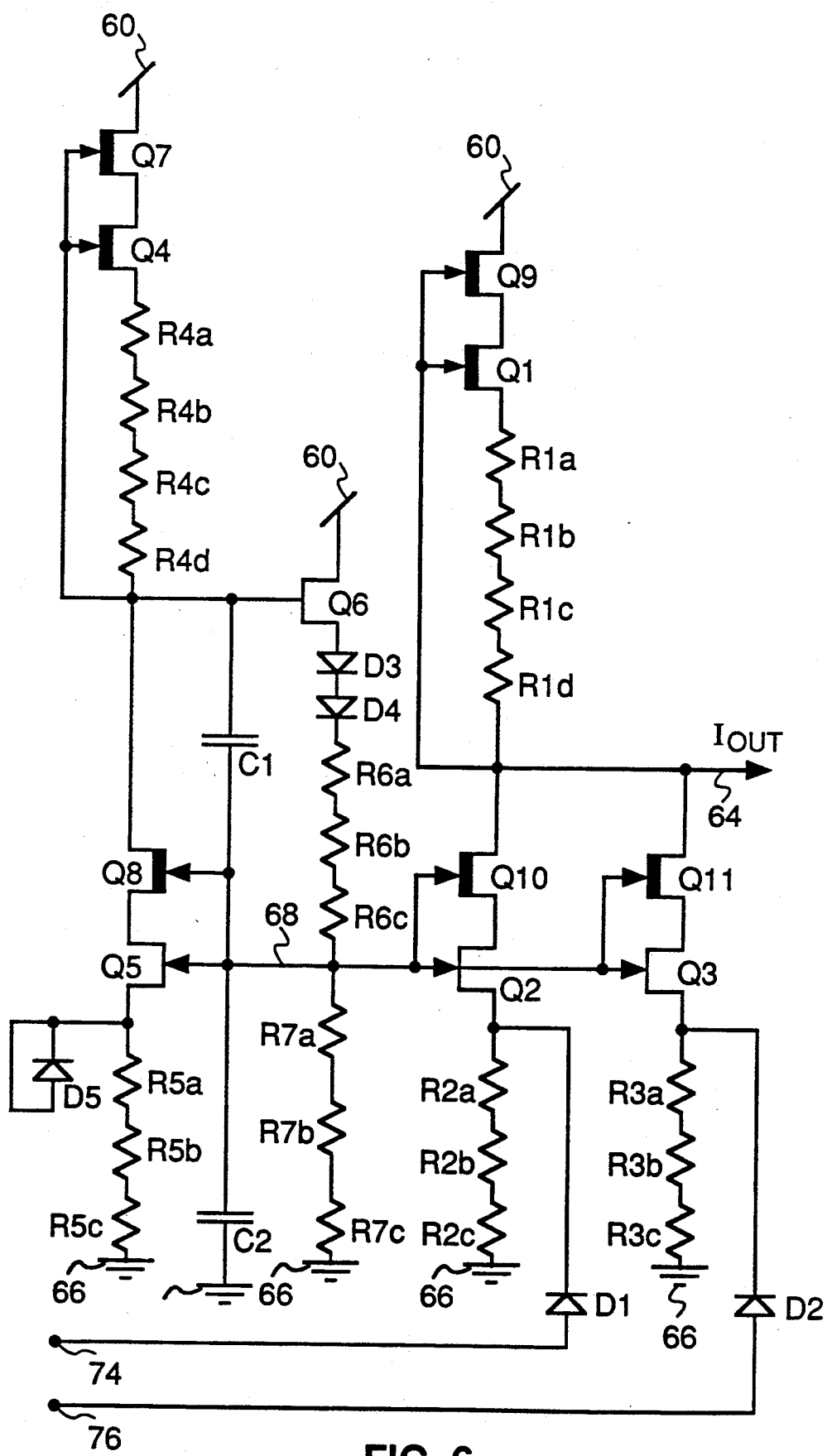
FIG. 6 shows an actual circuit embodiment of FIG. 5.

FIG. 6 shows an actual embodiment of the invention which is equivalent to FIG. 5 in all respects, wherein various design techniques have been used to improve the operation of the circuit or to facilitate the layout of the circuitry. Transistors, diodes, and conductors shown in FIG. 6 which are labeled identical to those transistors, diodes, and conductors in FIG. 5 provide the corresponding function as explained with respect to FIG. 5.

As seen in FIG. 6, to isolate the drain of transistor Q4 from any variations in supply voltage, depletion mode transistor Q7 is inserted between the drain of transistor Q4 and power supply voltage terminal 60 so as to maintain a relatively constant $V_{DS}$ across transistor Q4. In FIG. 6, four resistors R4a-R4d in series are used in place of resistor R4 in FIG. 5 to facilitate the layout of the circuit.

The circuitry of FIG. 6 may be modified so that the gate of transistor Q7 is not directly connected to the gate of transistor Q4 but is instead connected between resistors R4c and R4d to ensure the proper operation of transistor Q4 if the $V_{GS}$ of transistor Q7 is not sufficiently negative.

Transistor Q8 isolates the drain of transistor Q5 from $V_{DS}$ fluctuations in a manner identical to the way transistor Q10 isolates transistor Q2 and transistor Q11 isolates transistor Q3. This helps ensure, through the biasing circuit, that the current in transistor Q1 is reproduced accurately in transistors Q2 and Q3.

Similarly, transistors Q9, Q10, and Q11 isolate the drains of transistors Q1, Q2, and Q3, respectively, from fluctuations in voltage at their respective drains. The gate of transistor Q9 should be connected to match the connection of the gate of transistor Q7.

The various resistors shown in FIG. 5 are represented in FIG. 6 as each comprising three or four resistors (e.g. R1a-R1d) to facilitate the layout of the circuit.

Capacitors C1 and C2 are serially coupled between the gate of transistor Q6 and ground terminal 66, and their common node is connected to the gate of transistor Q5, as a filtering means to help maintain a relatively constant voltage at the gates of transistors Q2, Q3, and Q5.

Diode D5 is included in the layout to provide better matching between resistor R5 and resistors R2 and R3. The layout of diode D5 is identical to the layout of diodes D1 and D2, so that any influence diodes D1 and D2 have on their associated resistors is duplicated by diode D5.

In an ideal current pump, conductor 64 of FIGS. 5 and 6 can take on a wide range of values. The level shifter within biasing circuit 70 should be designed in such a way as to optimize the performance of the current pump over a desired range of voltages on conductor 64. One example might be to center the drain voltage of transistor Q5 so that it is in the center of the range of voltages on conductor 64. The implementation shown in FIGS. 5 and 6 is optimized for a particular application, but it should be obvious that other level shifters could be used in other applications.

The circuits of FIGS. 4-6 may be implemented using any transistor technology, such as bipolar or field effect technology, and may be implemented using any semiconductor technology such as silicon or compound semiconductor technology.

The preferred embodiment of the present invention is constructed only of components commonly and currently available in GaAs or compound semiconductor technology. For example, the preferred embodiment of the invention does not depend on the use of insulated gate devices or other structures not easily manufacturable in GaAs. In addition, the MESFETs used in the preferred embodiments are biased in such a way that the gate to source diode is not generally forward biased or conducting current.

While particular embodiments of the present invention have been shown and described, it will be obvious to those skilled in the art that changes and modifications may be made without departing from this invention in its broader aspects and, therefore, the appended claims are to encompass within their scope all such changes and modifications as falling within the true spirit and scope of this invention.

What is claimed is:

1. A circuit comprising:
   a first current source means having a first terminal connected to a first reference level terminal and having a second terminal coupled to an output node;
   a second current source means having a first terminal connected to said output node and having a second terminal connected to a second reference level terminal;
   a third current source means having a first terminal connected to said output node and having a second terminal coupled to said second reference level terminal;
   a first switch means operatively associated with said second current source means to cause said second current source means to change a current provided to said output node, wherein said first switch means is actuated by a first control signal; and
   a second switch means operatively coupled to said third current source means to cause said third current source means to affect a current provided to said output node, wherein said second switch means is actuated by a second control signal.

2. The circuit of claim 1 wherein said first, second, and third current source means are for providing a similar magnitude of current.

3. The circuit of claim 2 wherein said first current source means comprises a first transistor having a first current handling terminal coupled to said first reference level terminal, having a second current handling terminal coupled to a first terminal of a first load means, and having a current control terminal coupled to a second terminal of said first load means.

4. A circuit comprising:
   a first current source means having a first terminal connected to a first reference level terminal and having a second terminal coupled to an output node;
   a second current source means having a first terminal connected to said output node and having a second terminal connected to a second reference level terminal;
   a third current source means having a first terminal connected to said output node and having a second terminal coupled to said second reference level terminal;
   a first switch means operatively associated with said second current source means to cause said second current source means to change a current provided to said output node, wherein said first switch means is actuated by a first control signal;
   a second switch means operatively coupled to said third current source means to cause said third current source means to affect a current provided to said output node, wherein said second switch means is actuated by a second control signal,
   wherein said first, second, and third current source means are for providing a similar magnitude of current,
   wherein said first current source means comprises a first transistor having a first current handling terminal coupled to said first reference level terminal, having a second current handling terminal coupled to a first terminal of a first load means, and having a current control terminal coupled to a second terminal of said first load means,
   wherein said second current source comprises a second transistor having a first current handling terminal connected to said second terminal of said first load means, having a second current handling terminal connected to said second reference level terminal through a second load means, and having a current control terminal coupled to a reference voltage.

5. The circuit of claim 4 wherein said third current source comprises a third transistor having a first current handling terminal connected to said second terminal of said first load means, having a second current handling terminal connected to said second reference level terminal through a third load means, and having a current control terminal coupled to said reference voltage.

6. The circuit of claim 5 wherein said first switch means and said second switch means is a diode.

7. The circuit of claim 6 wherein said first switch means is a diode having a first terminal connected to said second current handling terminal of said second transistor and having a second terminal coupled to receive a first control signal.

8. The circuit of claim 7 wherein said second switch means is a diode having a first terminal connected to said second current handling terminal of said third transistor and having a second terminal coupled to receive a second control signal.

9. The circuit of claim 5 wherein said current control terminals of said second and third transistors are coupled to an output of a biasing circuit.

10. The circuit of claim 9 wherein said biasing circuit comprises a fourth current source means having a first current handling terminal coupled to said first reference level terminal and having a second current handling terminal connected to said second reference level terminal through a fourth transistor, said fourth transistor having a first current handling terminal connected to said second current handling terminal of said fourth current source, having a second current handling terminal connected to said second reference level terminal through a fourth load means, and having a current control terminal made common with said current control terminals of said second and third transistors.

11. The current pump of claim 10 further comprising a level shifter means connected between said current control terminal of said fourth transistor and a drain of said fourth transistor.

12. A method of selectively applying a current to an output lead comprising the steps of:
   providing a first current to an output lead;
   providing a second current switchably coupled to said output lead; and
   providing a third current switchably coupled to said output lead,
   wherein said second and third currents are of a magnitude equal to a magnitude of said first current but of opposite direction.

* * * * *